United States Patent [19]

Miyoshi et al.

[11] Patent Number: 4,640,436
[45] Date of Patent: Feb. 3, 1987

[54] HERMETIC SEALING COVER AND A METHOD OF PRODUCING THE SAME

[75] Inventors: Akio Miyoshi; Akira Fukami, both of Nishitama, Japan

[73] Assignee: Sumitomo Metal Mining Co., Ltd., Tokyo, Japan

[21] Appl. No.: 836,493

[22] Filed: Mar. 5, 1986

[30] Foreign Application Priority Data

Mar. 8, 1985 [JP] Japan .................................. 60-45935

[51] Int. Cl.⁴ .............................................. B65D 41/00
[52] U.S. Cl. .................................... 220/359; 220/200; 29/588; 174/52 S
[58] Field of Search ................. 220/220, 359, 378, 66, 220/200; 174/52 S; 29/588, 502; 219/91, 85

[56] References Cited

U.S. PATENT DOCUMENTS 3,823,468  7/1974  Hascoe .
3,874,549  4/1975  Hascoe .
3,946,190  3/1976  Hascoe .
4,560,084  12/1985 Wolfson .............................. 220/359

Primary Examiner—George T. Hall
Attorney, Agent, or Firm—Watson, Cole, Grindle & Watson

[57] ABSTRACT

A hermetic sealing cover assembly for a semiconductor device, etc. has a seal ring and a metallic cover joined thereto. The seal ring has a thin layer of gold, silver, platinum or palladium. The cover has a film of a material of high solderability, such as gold or nickel, formed at least on the peripheral edge of its surface facing the seal ring. The ring is joined in its entirety to the peripheral edge of the cover so that the layer on the ring may be bonded to the film on the cover. A method of producing such a sealing cover assembly is also disclosed.

12 Claims, 3 Drawing Figures

HERMETIC SEALING COVER AND A METHOD OF PRODUCING THE SAME

BACKGROUND OF THE INVENTION

1. Field of the Invention:

This invention relates to a sealing cover which is particularly suitable for the hermetic sealing of a semiconductor device, and a method of producing the same.

2. Description of the Prior Art:

There is known a ceramic package for a semiconductor element as is typically shown in FIG. 2. It includes a ceramic substrate 1 which comprises an integral assembly of a lower sheet having at its center a metallized layer for bonding a semiconductor element, a middle sheet carrying a lead pattern and having an opening at its center and an upper sheet having an opening which is larger than the opening of the middle sheet to allow the exposure of the inner ends of the lead pattern therethrough. A plurality of metallic leads 2 are bonded to the longitudinal edges of the substrate for connection to the outer ends of the lead pattern. The edge of the upper sheet surrounding its opening has a metallized layer 3 to which a cover is attached. The metallized layer 3 and the lead pattern are usually formed from an electrically conductive paste of a compound of molybdenum and manganese. The leads 2, the metallized layer 3 and the lead pattern are usually plated with gold.

The package is usually produced by a process which comprises bonding the semiconductor element 4 to the central recess of the substrate 1, connecting the electrodes on the element 4 to the inner ends of the lead pattern by thin connector wires 5, placing a seal ring 6 and a metallic cover 7 on the metallized layer 3, heating the seal ring 6 to a temperature not lower than its melting point, cooling it and attaching the cover 7 to the seal ring. The step of attaching the cover 7 is usually called hermetic sealing. While a Au-Si alloy solder is used for bonding the semiconductor element 4, a solder having a lower melting point, such as a Au-Sn or Pb-Sn alloy solder, is used for the seal ring 6. The cover 7 is usually formed from Kovar (tradename of an Fe-Ni-Co alloy). At least those edge portions of the cover 7 which are brought into contact with the seal ring 6 are usually coated with a film of, say, gold or nickel having good solderability.

One of the important things in the step of hermetic sealing is to place the seal ring 6 and the cover 7 on the metallized layer 3 so that their peripheral edges may be aligned with each other substantially perfectly. This is, however, a very difficult job, since the seal ring 6 has a thickness of only about 50 microns which makes it very difficult to handle and liable to displacement by even a slight vibration. A hermetically sealed assembly in which the cover 7 is not correctly positioned is often produced. This problem can be overcome if the seal ring 6 can be attached to the cover 7 beforehand. Therefore, there are known various methods which employ the spot welding of the seal ring 6 to the cover 7 at a plurality of spots, as disclosed in, for example, U.S. Pat. Nos. 3,823,468, 3,874,549 and 3,946,190. The spot welding, however, gives rise to a number of problems. For example, the solder is melted at each welded spot and the molten solder and the metal coating on the cover 7 form a material of different composition having a higher melting point. As a natural consequence, the seal ring 6 fails to melt uniformly during the step of hermetic sealing. Another problem is due to the welding rod which is used for spot welding. It leaves impressions at the welded spots and they are likely to form voids during the step of hermetic sealing.

SUMMARY OF THE INVENTION

It is an object of this invention to provide an improved hermetic sealing cover which is protected from being oxidized and prevents the formation of voids during storage and the step of hermetic sealing.

This object is attained by a hermetic sealing cover which comprises a seal ring having a thin layer of a metal selected from the group consisting of gold, silver, platinum and palladium, and a metallic cover having a film of a material of high solderability at least on the peripheral edge of its surface facing the seal ring, the seal ring being joined to the peripheral edge of the surface of the cover in its entirety so that the thin layer may be bonded to the film.

It is another object of this invention to provide an improved and reliable method of producing a hermetic sealing cover.

This object is attained by a method which comprises placing a seal ring on a metallic cover so that their peripheral edges may be aligned with each other substantially perfectly, the seal ring having a thin layer of a metal selected from the group consisting of gold, silver, platinum and palladium at least on its surface facing the cover, while the cover has a film of a material of high solderability at least on the peripheral edge of its surface facing the seal ring, and heating the seal ring and the cover to a temperature which is lower than the melting point of the seal ring, while applying pressure to the seal ring and the cover along the entire peripheral edges thereof.

According to this invention, the seal ring has a thin layer of a metal having good ductility. The seal ring is uniformly bonded around its entire periphery to the peripheral edge of the cover. The ring melts uniformly along its entire periphery during the step of hermetic sealing without forming any void and thereby provides a highly reliable seal.

DETAILED DESCRIPTION OF THE INVENTION

Figure 1:
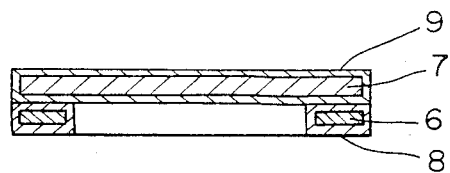
FIG. 1 is a vertical sectional view of a hermetic seal cover embodying this invention.
Figure 2:
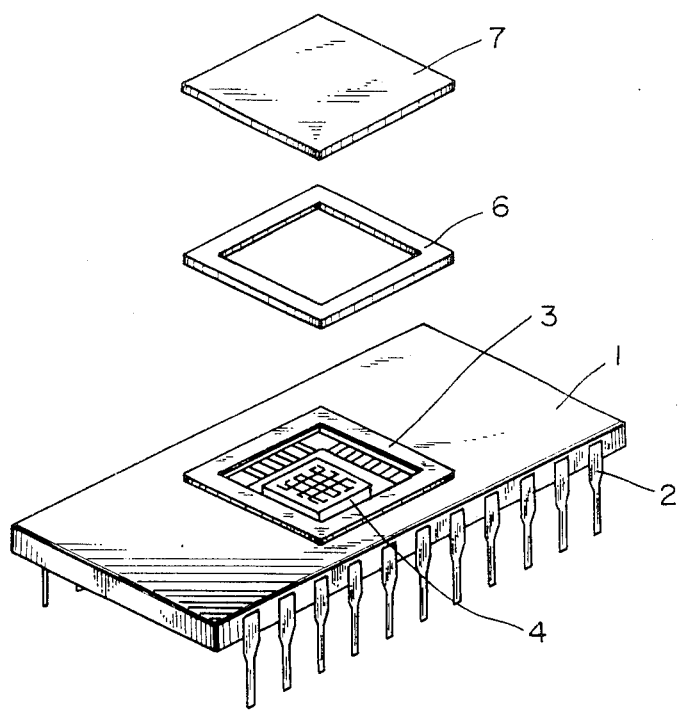
FIG. 2 is an exploded perspective view of a conventionally known ceramic package for a semiconductor element.
Figure 3:
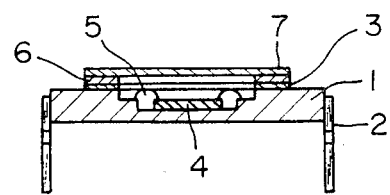
FIG. 3 is a vertical sectional view of the package shown in FIG. 2, but having its parts put together.

Referring to FIG. 1 in further detail, there is shown a hermetic sealing cover assembly embodying this invention. It includes a seal ring 6 having its whole surface coated with a thin layer 8 of gold. It also includes a cover 7 having its whole surface coated with a film 9 of gold. The thin layer 8 on the ring 6 is in intimate contact with the metallic cover 7. The film 9 on the cover 7 is provided for improving solderability. Therefore, it is sufficient for the film 9 to exist at least on the peripheral edge of the surface of the cover 7 facing the seal ring 6. The film 9 may be formed from any metal, such as gold or nickel, or any alloy if it adheres closely to the material of the cover 7, and if it is satisfactorily wetted with a solder on the seal ring 6 and melted therein so that it may not lower the reliability of the solder. In order to form the thin layer 8 on the seal ring 6, it is possible to use silver, platinum or palladium in addition to gold. It is sufficient for the layer 8 to exist at least on that surface of the seal ring 6 which faces the cover 7. The layer 8 can be formed by a wet coating method, or a dry coating method, such as vacuum deposition, sputtering or ion plating, or roll cladding.

The layer 8 preferably has a thickness of, say, 0.05 to 5 microns. If it is thinner, the metal forming it is diffused into the seal ring 6 and fails to provide the necessary bonding strength. The use of too thick a layer should also be avoided, since a longer time is required for hermetic sealing, and since a larger amount of metal is dissolved in the solder. A layer thickness of, say, 0.3 to 1.5 microns is particularly preferred. The seal ring 6 having the layer 8 can be produced if the solder is rolled, punched and plated, or if the solder is rolled, plated or punched, or if the layer 8 is applied by roll cladding.

The seal ring 6 can be bonded to the cover 7 if they are heated to a temperature which is lower than the melting point of the seal ring 6, while pressure is applied uniformly to the entire peripheral edges of the seal ring 6 and the cover 7. The temperature and pressure depend on the metal forming the layer 8 on the seal ring 6, and must be determined experimentally on a case to case basis. If the layer 8 is of gold, it is sufficient to employ a temperature of 260° C. to 280° C. at a pressure of 55 g/mm$^2$. A lower temperature can be employed if a higher pressure is used. The use of ultrasonic vibration with the application of pressure further facilitates the bonding of the seal ring to the cover.

The atmosphere in which the seal ring 6 is bonded to the cover 7 depends on the materials of the layer 8 on the seal ring 6 and the film 9 on the cover 7 and the relation which the layer 8 may have on the film 9. It is sufficient to carry out their bonding in the open air if both the layer 8 and the film 9 are of gold, and if the layer 8 covers the whole surface of the ring 6. It is, on the other hand, necessary to employ a neutral or reducing atmosphere if the film 9 on the cover 7 is of nickel.

There is no limitation to the material of the seal ring 6. It can, for example, be formed from a Au-Sn or Pb-Sn solder alloy, or a Au-In, Au-Si or Au-Ge alloy. There is no limitation to the material of the cover 7, either, nor is there any limitation to its shape.

This invention is useful for the hermetic sealing of not only semiconductor devices, but also a wide variety of other products.

The invention will now be described more specifically by way of example.

EXAMPLE

A plurality of covers and seal rings were prepared. Each cover was a 10 mm square, 0.25 mm thick Kovar sheet having its whole surface coated with a gold film having a thickness of two microns. Each seal ring was a 10 mm square ring of a eutectic Au-Sn alloy having an 8.6 mm square opening. Each ring had its whole surface coated with a thin layer of gold having a thickness which differed from one ring to another. The different thicknesses of the gold layers on the different rings were 0.02, 0.05, 0.1, 1.0 and 3.0 microns.

Each of the seal rings was joined to one of the covers. For this purpose, the seal ring was placed on a heating block having a temperature of 270° C., the cover was placed on the seal ring so that their peripheral edges might be aligned with each other substantially perfectly, a holding jig was placed on the cover and a pressure of 55 g/mm$^2$ was applied to the jig for 10 seconds.

Each ring and cover assembly was, then, subjected to a peeling test. The test was conducted by pulling the seal ring transversely by the nail of a fixture connected to a push-pull gage and measuring the force which had been applied when the seal ring was separated from the cover. The seal ring having a gold layer thickness of 0.02 micron peeled away when a force not exceeding 1 g was applied. The ring having a gold layer thickness of 0.05 micron peeled away when a force of 10 g was applied. None of the other rings peeled away until a force of about 22 g was applied.

What is claimed is:

1. A hermetic sealing cover assembly comprising:
   a seal ring having a thin layer of a metal selected from the group consisting of gold, silver, platinum and palladium; and
   a metallic cover having a film of a material of high solderability at least on the peripheral edge of its surface facing said seal ring, said seal ring being joined to said peripheral edge of said cover in its entirely so that said layer may be bonded to said film.

2. A cover assembly as set forth in claim 1, wherein said layer has a thickness of 0.05 to 5 microns.

3. A cover assembly as set forth in claim 2, wherein said thickness is from 0.3 to 1.5 microns.

4. A cover assembly as set forth in claim 1, wherein said layer is formed by a method selected from wet coating, vacuum deposition, sputtering, ion plating and roll cladding.

5. A cover assembly as set forth in claim 1, wherein said seal ring is formed from an alloy selected from the group consisting of Au-Sn, Pb-Sn, Au-In, Au-Si and Au-Ge alloys.

6. A cover assembly as set forth in claim 1, wherein said film is formed from a metal selected from the group consisting of gold and nickel.

7. A method of producing a hermetic sealing cover assembly which comprises:
   placing a seal ring on a metallic cover so that their peripheral edges may be aligned with each other substantially perfectly, said seal ring having a thin layer of a metaL selected from the group consisting of gold, silver, platinum and palladium at least on its surface facing said cover, while said cover has a film of a material of high solderability at least on the peripheral edge of its surface facing said seal ring; and
   heating said seal ring and said cover to a temperature which is lower than the melting point of said seal ring, while applying pressure to said seal ring and said cover along the entire peripheral edges thereof.

8. A method as set forth in claim 7, wherein said layer has a thickness of 0.05 to 5 microns.

9. A method as set forth in claim 8, wherein said thickness is from 0.3 to 1.5 microns.

10. A method as set forth in claim 7, wherein said layer is formed by a method selected from wet coating, vacuum deposition, sputtering, ion plating and roll cladding.

11. A method as set forth in claim 7, wherein said seal ring is formed from an alloy selected from the group consisting of Au-Sn, Pb-Sn, Au-In, Au-Si and Au-Ge alloys.

12. A method as set forth in claim 7, wherein said film is formed from a metal selected from the group consisting of gold and nickel.

* * * * *